United States Patent
Besling et al.

(10) Patent No.: US 8,570,706 B2
(45) Date of Patent: Oct. 29, 2013

(54) TANTALUM-BASED ELECTRODE STACK

(75) Inventors: Willem F. A. Besling, Eindhoven (NL); Aarnoud L. Roest, Geldrop (NL); Klaus Reimann, Eindhoven (NL); Linda van Leuken-Peters, Maarheeze (NL)

(73) Assignee: NXP B.V., Eindhoven (NL)

(*) Notice: Subject to any disclaimer, the term of this patent is extended or adjusted under 35 U.S.C. 154(b) by 402 days.

(21) Appl. No.: 12/861,785

(22) Filed: Aug. 23, 2010

(65) Prior Publication Data

US 2012/0044612 A1 Feb. 23, 2012

(51) Int. Cl.
*H01G 4/008* (2006.01)

(52) U.S. Cl.
USPC .............................................. 361/305

(58) Field of Classification Search
USPC ............... 361/278, 303, 305, 301.1; 257/532
See application file for complete search history.

(56) References Cited

U.S. PATENT DOCUMENTS

| 8,130,483 B2* | 3/2012 | Chung | 361/301.4 |
| 2011/0057292 A1* | 3/2011 | Hu | 257/532 |

OTHER PUBLICATIONS

D. Hoogeland, et. al.: 'Plasma-Assisted Atomic Layer Deposition of TiN/Al2O3 Stacks for MOS Capacitor Applications,' Journal of Applied Physics, 106, (2009).

T. Maeder, et. al.: 'Conducting Barriers for Direct Contact of PZT Thin Films on Reactive Substrates,' Journal of the Electrochemical Society, 146, pp. 3393-3397, (1999).

P. Muralt, et. al, : 'Texture Control of PbTiO3 and Pb(Zr,Ti)O3 Thin Films with TiO2 Seeding,' Journal of Applied Physics, vol. 83, No. 7, pp. 3835-3841, (Apr. 1998).

M. Klee, et al. : 'Ferroelectric and Piezoelectric Thin Films and Their Applications for Integrated Capacitors, Piezoelectric Ultrasound Transducers and Piezoelectric Switches,' Materials Science and Engineering 8, pp. 1-12, (2008).

T. Maeder, et al.: 'Stabilized Platinum Electrodes for Ferroelectric Film Deposition Using Ti, Ta and Zr Adhesion Layers,' Journal Applied Physics vol. 37, pp. 2007-2012, (1998).

L. Sagalowicz, et al. : 'Stoichiometry and Interdiffusion in PZT Thin Films Studied by Transmission Electron Microscopy,' Materials Research. Society Symp. Proc. vol. 596, pp. 265-270 (2000).

J., A., Kittl, et al. : 'High-k Dielectrics and Metal Gates for Future Generation Memory Devices,' The Electrochemical Society, pp. 29-40, (2009).

\* cited by examiner

*Primary Examiner* — Jayprakash N Gandhi
*Assistant Examiner* — Hung Dang

(57) ABSTRACT

An electronic device includes a metal-insulator-metal capacitive device. In connection with an example embodiment, a metal-insulator-metal (MIM) capacitor device is in a substrate having a surface and a three dimensional structure with high aspect ratio sidewalls. The MIM capacitor device includes a first capacitor electrode including a platinum group metal (PGM)-based layer and a Ta-based layer that is between the PGM-based layer and one of the sidewalls. The MIM capacitor also includes a second capacitor electrode and an insulator material between the first and second electrodes.

21 Claims, 6 Drawing Sheets

TANTALUM-BASED ELECTRODE STACK

Figure 1:
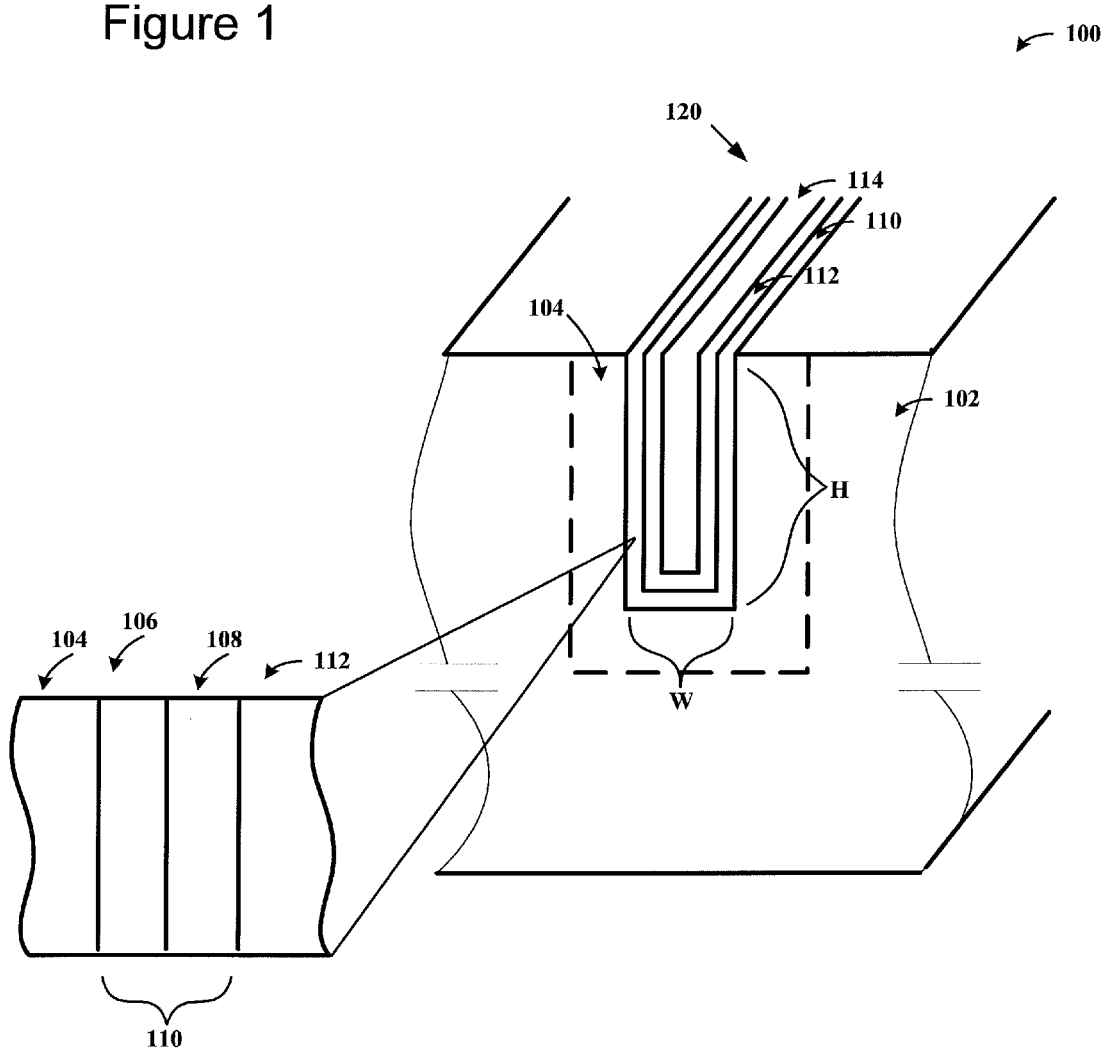

A general trend in the integrated circuit (IC) industry is the miniaturization of components. New technologies are being developed to integrate thin-film capacitors with high capacitance densities on silicon chips. Two related technology routes include 3D trench capacitors or planar, complex oxide capacitors such as ferroelectric MIM capacitors. Both capacitor types are suited for RF-decoupling. In forming a ferroelectric capacitor, high annealing temperatures are often needed to create an insulator having favorable crystalline phase and a high dielectric constant. There is also a trend for the 3D capacitors to move to dielectric materials with dielectric constants above 100. Dielectric materials such as $SrTiO_3$, $BaTiO_3$, and BST are often deposited at low temperatures in an amorphous state. The films require high annealing temperatures to transform them into a crystalline state with high dielectric permittivity (typically >600° C. in oxygen environment).

In the past, several bottom electrode systems for deposition of ferroelectric thin films, onto reactive substrates or reactive metal films have been investigated for chemical barrier properties and contact resistivity. Generally, a metal electrode stack for such systems includes an adhesion layer of $TiO_2$/Ti underneath a more noble and oxidation resistant top metal layer, such as Pt. The adhesion layer is used to mitigate the adhesion problems of the metal layer to the underlying dielectric. The thickness of the Ti layer affects the level of oxidation of the metal electrode due to migration of Ti towards the Pt surface and subsequent oxidation. The migration of Ti to the surface of the Pt layer degrades the effective dielectric constant and causes leakage current and electrical breakdown. These and other matters have presented challenges to the implementation of electrode stacks.

Certain embodiments of the present disclosure are directed to a metal electrode stack that resists oxidation during high-temperature anneals. In certain embodiments the metal electrode stack has low reactivity with high-k and/or Li-containing materials. In still other embodiments the metal electrode stack has low resistivity and good adhesion to underlying dielectric layers (e.g., shows little or no delamination or hillocking after anneal).

Certain embodiments of the present disclosure are directed to an electronic device including a substrate having a high-aspect ratio three-dimensional structure etched in the substrate with sidewalls having a high aspect ratio. A metal-insulator-metal (MIM) capacitor is formed in the three-dimensional structure. The capacitor includes a first capacitor electrode including a Platinum Group Metal (PGM)-based layer and a Ta-based layer. The Ta-based layer is between the PGM-based layer and one of the sidewalls. The capacitor also includes a second capacitor electrode and an insulator material between the first and second electrodes. In various embodiments the PGM-based layer is Platinum. In certain embodiments the Ta-based layer is Tantalum with a small percentage of Nitrogen present in solid solution. In certain embodiments the nitrogen is used to facilitate the disposition of low resistive crystallographic Ta β phase.

In various embodiments, a MIM capacitor using a Ta/Pt stack consistent with the present disclosure can be used for RF decoupling. In other embodiments the MIM capacitor can be used in EST protection applications. The Ta/Pt electrode stack can also be used in electrochemical capacitors and solid state Li-ion batteries.

The disclosure may be more completely understood in consideration of the detailed description of various embodiments of the disclosure that follows in connection with the accompanying drawings as follows:

FIG. 1 depicts a MIM trench capacitor consistent with an embodiment of the present disclosure; and FIGS. 2A-2G depict different stages of the formation of a 3D capacitor, consistent with additional example embodiments of the present disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

In certain embodiments, a three-dimensional (3D) metal electrode stack has a three dimensional structure with high aspect ratio features, with layers, including an adhesion layer, along the high aspect ratio features used to form the stack. The relative thicknesses of the layers are set based upon step coverage of the materials used to form the layers, and further upon the shape of the three dimensional structure (e.g., as relative to the ability of the respective materials to provide adequate coverage to suit particular applications). The resulting three-dimensional metal electrode stack (or stacks, where several are implemented) can facilitate desirable consolidation of features in an available area, such as for area enhancement with metal-insulator-metal (MIM) capacitors, with respective adhesion and metal layers having thicknesses set in accordance with the above.

The three dimensional structure is formed in a variety of manners, depending upon the application. In some implementations, the three-dimensional structure is etched into a substrate, such as by forming a trench using a masking and etching process. In other implementations, the three-dimensional structure is built above a substrate, such as by growing or depositing high-aspect ratio features, or depositing material on the substrate and etching or otherwise processing the material to form a high-aspect ratio opening. Various layers of the three-dimensional electrode stack are then formed in the opening. Example three-dimensional structures include trenches, inverted pillars, honeycomb shaped structures, and structures with corrugated surfaces.

In certain embodiments, a three-dimensional stack includes an adhesion layer and a metal layer that includes a platinum group metal (PGM), which is used as a capping layer to mitigate or avoid oxidation of the underlying metal electrode stack. Platinum group metals used in the PGM layer may include, for example, Ru, Rh, Pd, Os, Ir and Pt.

In some embodiments, the material of the adhesion layer is chosen such that the diffusion is limited through the PGM layer which can further be used to facilitate the use of a relatively thick adhesion layer. For example, in certain embodiments a set (e.g., minimum) amount of thickness of the adhesion layer is needed to ensure that adhesion material is formed at the bottom of the trench. If the minimum thickness is not used, the film can delaminate inside the trench. However, if the film thickness of the adhesion layer is too large, the adhesion layer material may diffuse through the metal outer layer. The use of a combination of an appropriate adhesion layer and PGM layer can allow for a thicker adhesion layer and a relatively thin PGM layer without diffusion. This allows for savings, as the generally more expensive PGM layer is a smaller percentage of the combined thickness of the adhesion layer and the metal layer.

In certain embodiments of the present disclosure, an adhesion layer as discussed herein includes a Tantalum based material, such as Ta, TaN, Ta$_2$N or Ta(N) (e.g., Ta with a small percentage of nitrogen present in solid solution). In connection with these embodiments, it has been discovered that an adhesion layer having a Ta-based material exhibits low mobility at high annealing temperatures and does not diffuse through an upper metal layer of a Pt-group based material. Accordingly, various embodiments are directed to forming three-dimensional structures using a Ta-based layer for use in applications in which the resulting structure is annealed and/or otherwise directly involving annealing.

In some implementations, a small amount of nitrogen is used in a Physical Vapor Deposition (PVD) chamber during sputtering to favor the deposition of a low resistive crystallographic Ta β phase material for the adhesion layer. At higher nitrogen concentrations the nitrogen is incorporated into the crystal lattice under formation of a TaN or Ta$_2$N phase. Nitrogen is incorporated into the adhesion layer to slow the diffusion rate of other elements through the lattice or along the grain boundaries of the adhesion layer to improve the adhesion layer's resistance to oxidation.

In certain embodiments of the present invention, a metal electrode stack is applied in 2D and 3D capacitive structures, such as MIM (metal-insulator-metal) capacitors, and is configured to withstand high temperature annealing. A Ta-based adhesion layer is formed along high-aspect-ratio features of the structure, and a PGM-based electrode layer is formed on the Ta-based adhesion layer. A dielectric layer is formed on the PGM-based electrode layer, and a second electrode is formed on the dielectric layer to form the MIM structure with the PGM-based electrode layer.

Various dielectrics used in the creation of a capacitive structure as discussed herein may include Lead Zirconate Titanate (PZT), Strontium Titanate (STO) and Barium Strontium Titanate (BST). In some implementations, a high-k dielectric material that requires an annealing temperature of at least about 500° C. to acquire its high permittivity phase is deposited. In certain applications, a high-k dielectric including a PZT layer is deposited, which can be done at temperatures above 700° C. Other dielectric materials such as STO and BST are deposited at relatively low temperatures and then annealed at a high temperature (e.g., greater than 600° C.) to achieve a desired crystalline structure and dielectric constant of the material.

In a more specific embodiment, a Ta/Pt stack is applied directly on a dielectric such as Silicon Dioxide (SiO$_2$) with respective layer thicknesses and compositions that mitigate or eliminate delamination, hillocking or electrode roughening after a high temperature anneal in an oxygen rich environment. A Pt electrode interface is used to withstand high annealing temperatures in oxygen and to set desirable leakage current and breakdown behavior characteristics, relative to Pt's high work function. Ta is used as an adhesion layer for the Pt metal, using the Ta's relatively low mobility at high temperatures to mitigate diffusion of the adhesion layer material through the Pt layer and facilitate the use of relatively large Ta-based adhesion layer thickness.

In certain embodiments, PVD is used to deposit Ta and/or TaN films in medium aspect ratio structures. For higher aspect ratio trenches other deposition methods like chemical vapor deposition (CVD), metal-organic chemical vapor deposition (MOCVD), low-pressure CVD (LPCVD), plasma-enhanced CVD (PECVD), atomic layer deposition (ALD), plasma-enhanced ALD (PE-ALD), and plasma-assisted ALD (PA-ALD) can be used. ALD, for example, can be used to achieve good step coverage. Using ALD, a thin layer of Pt, Ru, Ir, PtO$_2$, RuO$_2$, IrO$_2$, or other PGMs can be deposited on top of an adhesion layer in order to improve the oxidation resistance and create high work function electrode properties. The adhesion layer can be deposited by a combination of different deposition techniques.

Consistent with another example embodiment of the present disclosure, an electronic device has a substrate and a three-dimensional (3D) MIM capacitor located in the substrate. The 3D MIM capacitor includes an adhesion layer on a substrate, a first metal layer on the adhesion layer, an insulator layer on the first metal layer, and a second metal layer on the insulator layer. The first metal layer, insulator layer and second metal layer respectively form the metal, insulator and metal portions of a MIM capacitor, with the first metal layer including a PGM material, and the second metal layer including a similar or different conductive material.

The adhesion layer is used to address adhesion characteristics of the PGM relative to the underlying substrate (e.g., a dielectric material) of the electronic device. In some implementations, the adhesion layer includes a Ta-based material that is used to mitigate delamination and hillocking of the PGM electrode after high temperature annealing, to address adhesion characteristics between PGM and the underlying substrate. The Ta-based adhesion layer can address adhesion issues via the formation of Ta—O bonds, and may also be used to facilitate the use of a relatively thin layer of PGM. In certain embodiments, the adhesion layer includes a relatively thick Ta-based adhesion layer (e.g. greater than 100 nm), which can serve to reduce the oxidation of the adhesion layer. The use of such a thick adhesion layer may further be facilitated by the use of the PGM in the first metal layer (e.g., with a correspondingly-selected adhesion material) to suppress diffusion tendencies of such a thick Ta-based layer.

Turning now to the figures, FIG. 1 shows a portion of an electronic device 100 with an MIM trench capacitor 120, in accordance with another example embodiment. The MIM capacitor 120 includes respective metal, insulator and metal portions 110, 112 and 114 in a trench region having height and width portions respectively shown as "H" and "W." This trench region exhibits a high aspect ratio (H:W), such as 2:1, 3:1, 4:1, 5:1 or greater. The trench region is in an insulating region 104 of the substrate 102, may be an oxidized portion of the substrate 102 or otherwise formed with an insulative type of material (e.g., via deposition).

The metal layer 110, as shown in the inset portion of FIG. 1, is formed on the insulating region 104 and includes a Ta-based adhesion layer 106 that can be deposited using one or more of various deposition techniques, such as PVD or ALD. The Ta-based adhesion layer 106 may include one or more of a variety of types of materials, depending upon the application and available materials. In certain embodiments the Ta-based adhesion layer 106 is Ta. In other embodiments, the Ta-based adhesion layer 106 includes one or more of TaN, Ta$_2$N, and Ta(N).

The thickness of the adhesion layer 106 can be set, for example, based on the aspect ratio of the trench as discussed above, with respective layers of the MIM trench capacitor 120 set to facilitate adhesion, depth coverage into the trench and MIM characteristics. For higher aspect ratio trenches, thicker films are used to facilitate the desired step coverage of the Ta-based material, which may relate to the aspect ratio of the trench. For example, using a step coverage of 15%, an amount of material thickness at an upper surface of the device 100, as needed to achieve a selected thickness in a lower region of the trench, can be determined. The step coverage, in this context, generally refers to a thickness of a material deposited on an upper surface of a substrate, relative to the thickness of the material deposited along lower sidewalls of the high aspect-ratio trench.

The metal layer 110 also includes a PGM-based layer 108, such as a platinum layer, that is deposited on the adhesion layer 106. An insulating layer 112 (e.g., including PZT, BST and/or STO) is deposited on the PGM layer. A second metal layer 114, which may include the same and/or different metal as used in the PGM layer 108, is formed in the center of the trench after the insulator layer 112 is deposited, and forms an MIM capacitor with the PGM layer and the insulator layer. The degree to which the adhesion layer 106 forms part of the metal electrode functions of the MIM capacitor 120 may vary, depending upon the application, thickness and type of materials used.

In some embodiments, nitrogen is used with the Ta-based adhesion layer 106 to improve the adhesion layer's resistance to oxidation. In embodiments with small amounts of nitrogen, if PVD sputtering is used, a low resistive crystallographic Ta β phase layer is deposited. At higher nitrogen concentrations the nitrogen is incorporated into the crystal lattice of the adhesion layer. In embodiments where the nitrogen is incorporated into the crystal lattice, the diffusion rate of other elements through the lattice or along the grain boundaries is slowed.

The thickness of the Ta-based adhesion layer 106 can be set to suit various applications. In certain embodiments, the Ta-based adhesion layer 106 has a thickness that facilitates coverage and good adhesion in high aspect-ratio 3D trench structures. In some implementations, the Ta-based adhesion layer 106 is formed in a 4:1 aspect ratio trench (e.g., height (H) to width (W) as shown), with a step coverage of about 15%.

In certain embodiments the electronic device 100 is configured for exposure to a high temperature anneal after the deposition (or other formation) of an insulator layer 108. In certain embodiments the high temperature anneal is greater than about 600° C. In certain embodiments the anneal is performed after deposition of the top metal electrode 114 to mitigate or avoid hillocking of the high-k material 112. In certain embodiments, a Ta/Pt stack is formed directly on a silicon dioxide substrate, and the adhesion layer is used to mitigate diffusion and effects of delamination, hillocking or electrode roughening after the high temperature anneal in an oxygen environment.

FIGS. 2A-2G depict an electronic device with a capacitor at various stages of implementation, consistent with one or more example embodiments of the present disclosure. Each of the embodiments as respectively shown in FIGS. 2A-2G may be implemented separately or in connection with one another or more embodiments as described elsewhere herein.

Figure 2A:
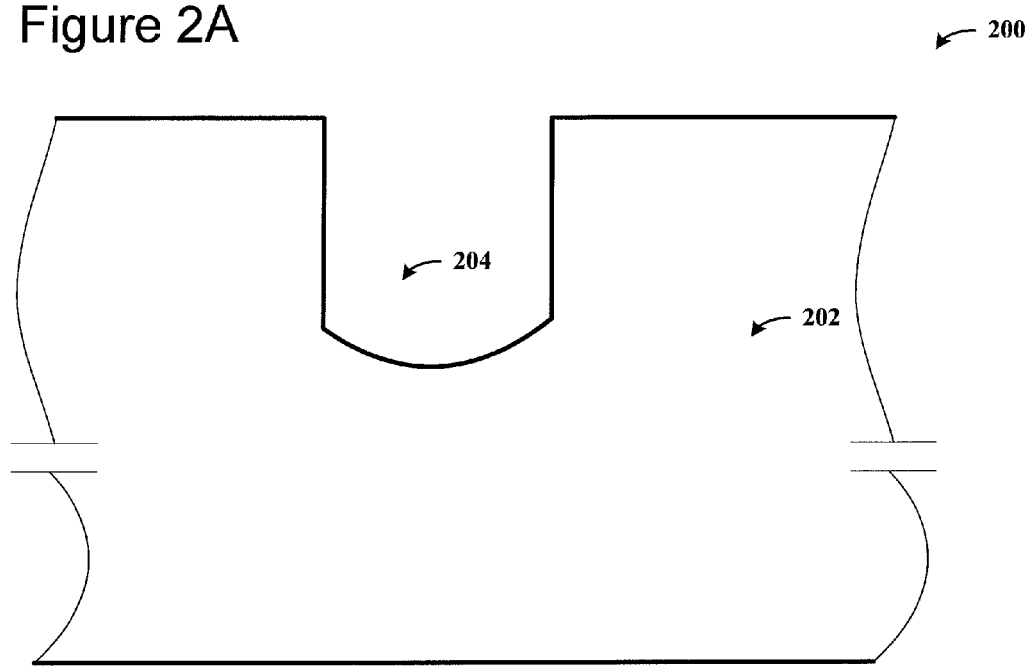

Beginning with FIG. 2A, a device 200 includes a substrate 202 having a three-dimensional structure 204 having high aspect ratio sidewalls, for the formation of a three-dimensional electrode. The substrate 202 includes a material such as silicon or other semiconductor material, gallium nitride, gallium arsenide or other III/V semiconductor compounds.

The three-dimensional structure 204 can be formed in a variety of manners, and may include a variety of surface regions and/or shapes, in addition to and/or in place of that shown. In some implementations, the three-dimensional structure 204 is formed as a trench in the substrate 202. In other implementations, the substrate 202 is formed above an underlying material, with the structure 204 built up via layering or other approaches. In certain embodiments, the three-dimensional structure 204 has a honeycomb shape, or a corrugated surface. In still other embodiments the three-dimensional structure 204 is formed at different relative positions, such as an inverted pillar or a hole. The three-dimensional structure 204 and the space it defines may also include a combination of one or more of the above mentioned structures, such as a trench with corrugated sidewalls.

Figure 2B:
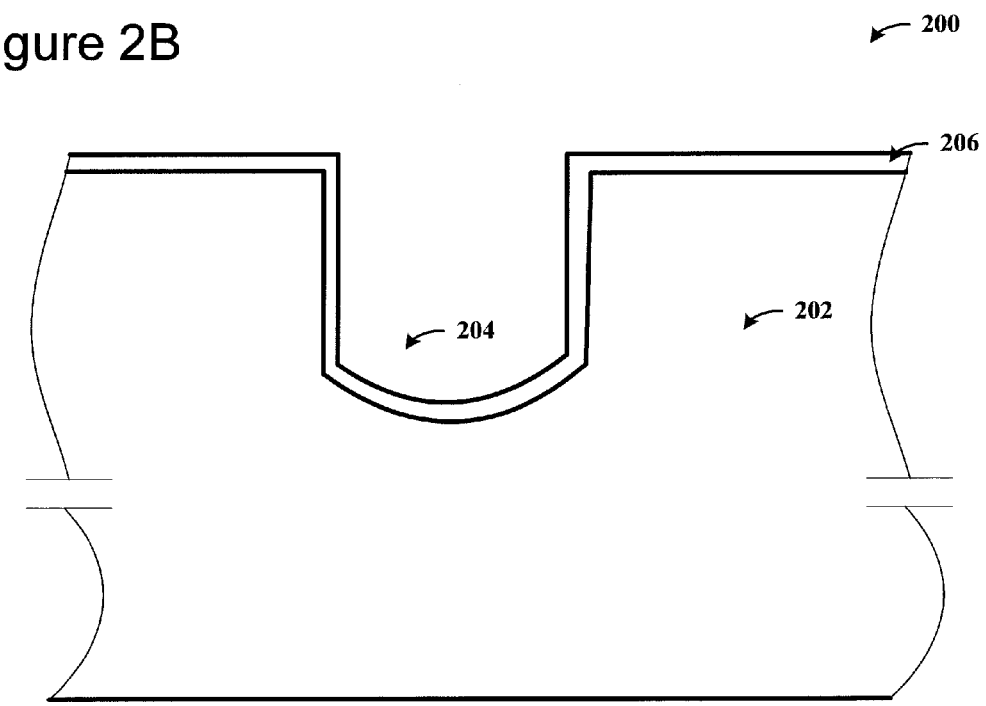

FIG. 2B depicts an electronic device 200 with substrate 202 and etched structure 204, such as depicted in FIG. 2A, having an isolation layer 206 on sidewalls and a lower portion of the etched structure. In certain embodiments, the isolation layer 206 is formed by exposing the substrate 202 to oxygen or water at elevated temperatures to form an oxide, such as silicon dioxide.

Figure 2C:
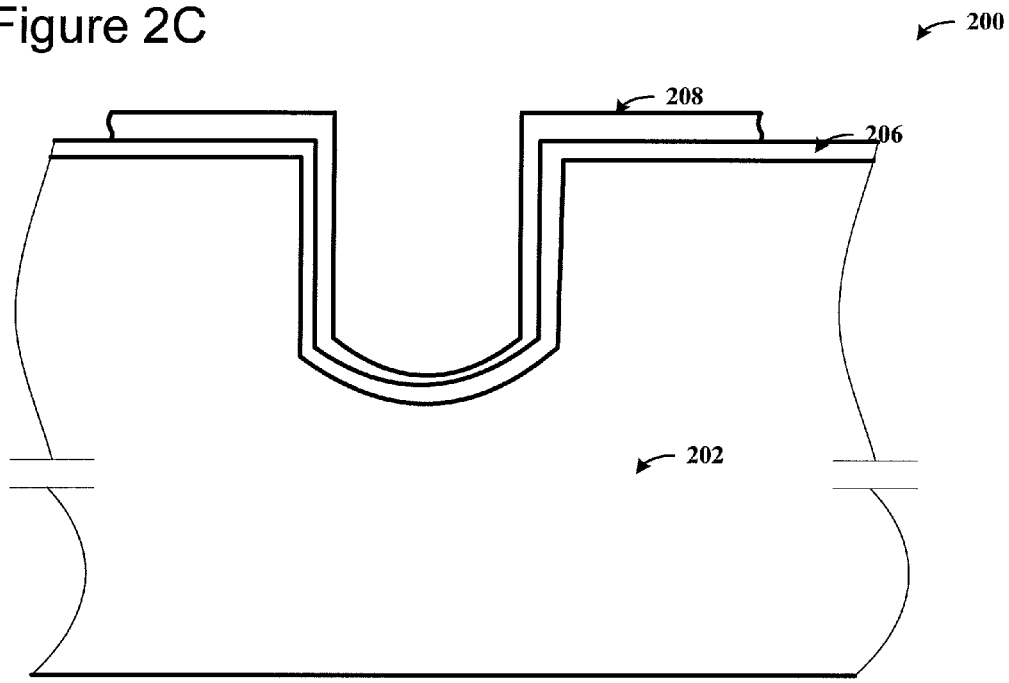

FIG. 2C depicts an electronic device 200, such as shown in FIG. 2B, with a Ta-based adhesion layer 208 deposited on an isolation layer 206. As consistent with the above discussion, the Ta-based adhesion layer 208 may include one or more of a Ta, TaN, Ta$_2$N or Ta(N) film, which can also be processed with nitrogen to improve the adhesion layer's resistance to oxidation.

Figure 2D:
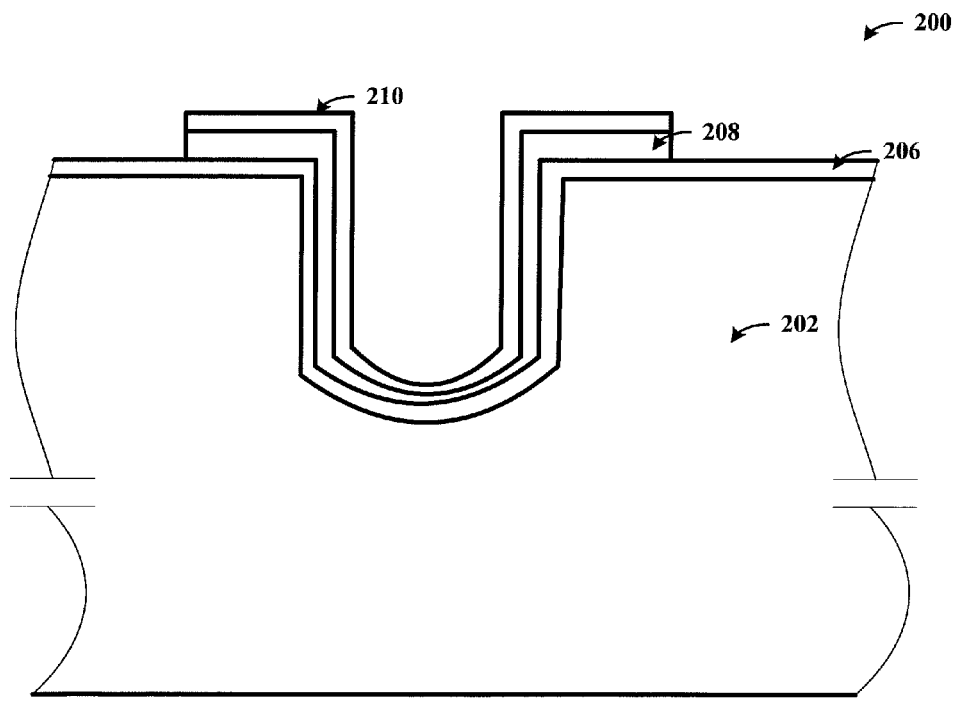

In FIG. 2D, a Pt-based layer 210 has been formed on a Ta-based adhesion layer 208, and the respective layers have been patterned, consistent with another example embodiment of the present disclosure. In some embodiments, the deposition of the Ta/Pt stack (208/210) is carried out without an air break to avoid oxidation of the interface between the Ta-based adhesion layer 208 and the Pt-based layer 210. In other embodiments, the Ta/Pt stack is patterned at a later step. The combination of Ta-based adhesion layer 208 and Pt-based layer 210 provides a Ta-based/Pt-based stack directly on the insulation layer 206. The Pt-based electrode interface allows for the use of high annealing temperatures in oxygen, such as for subsequent deposition of dielectric materials to form devices such as a MIM capacitor.

Figure 2E:
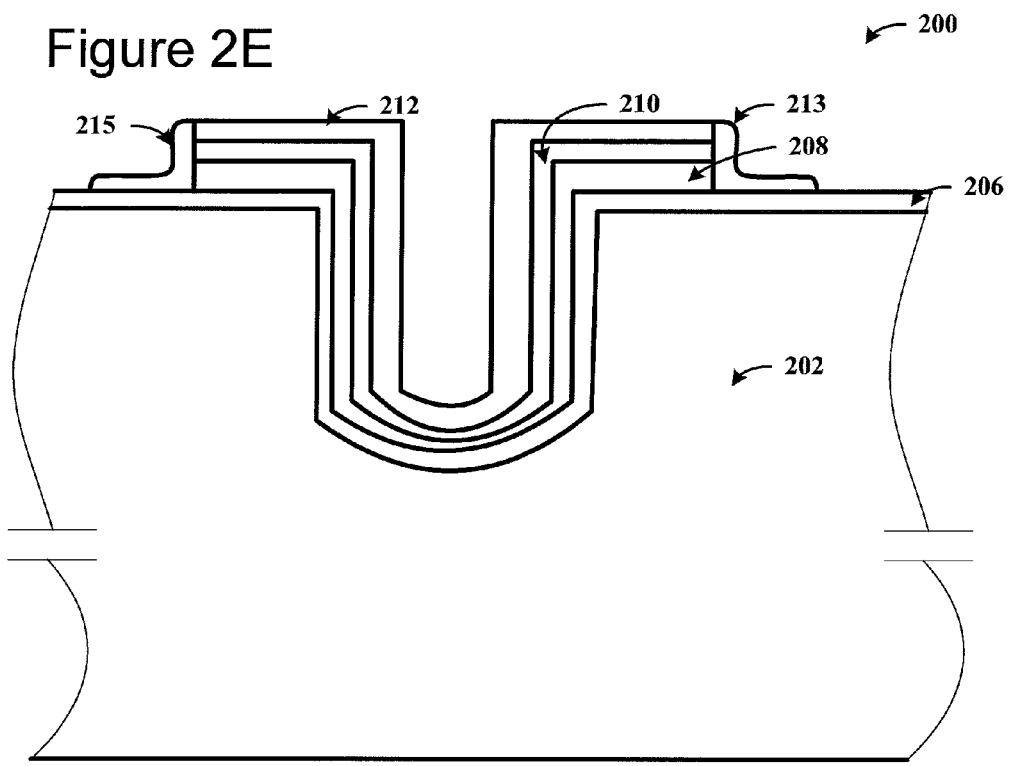

In FIG. 2E, a dielectric layer 212 has been formed on an underlying Pt-based layer 210, to form an insulative portion of a capacitive structure, and is shown to be patterned with the underlying Ta/Pt stack. In some embodiments, the dielectric layer 212 is patterned and etched in such a way that the dielectric area extends over the bottom electrode to avoid leakage around the edges of the capacitor area (e.g., as shown at 213 and 215). As consistent with the above discussion, the dielectric layer 212 may include a high-K dielectric such as PZT, or a material such as SrTiO$_3$, BaTiO$_3$, or Ba$_{1-x}$Sr$_x$TiO$_3$ (BST). In some implementations, these dielectric materials are deposited at low temperatures using one or more of metal-organic chemical vapor deposition (MOCVD), atomic vapor deposition (AVD), atomic layer deposition (ALD) or plasma-enhanced ALD (PE-ALD), and the materials can be formed in an amorphous state. High annealing temperatures (e.g., greater than about 600° C.) are used to transform the films into a crystalline state with high dielectric permittivity.

In connection with the above embodiments described in connection with FIGS. 2D and 2E, the metal layer 210 is chosen based on the properties of the dielectric and the application of the resulting capacitor structure. For example, Pt can be used with high-K PZT in MIM capacitors. Ir or IrOx may also be used as oxidation resistant electrode materials with high work function. Ru and RuO$_2$ can be used as electrodes for DRAM applications to reduce leakage current for SrTiO$_3$ based MIM capacitors. The combination of the Ta adhesion layer 208 and the Pt metal layer 210 is used to effect desirable diffusion properties with respect to materials of the dielectric material in layer 212. For example, a Ta/Pt/PZT stack shows little deformation from Pb diffusion from the PZT.

Figure 2F:
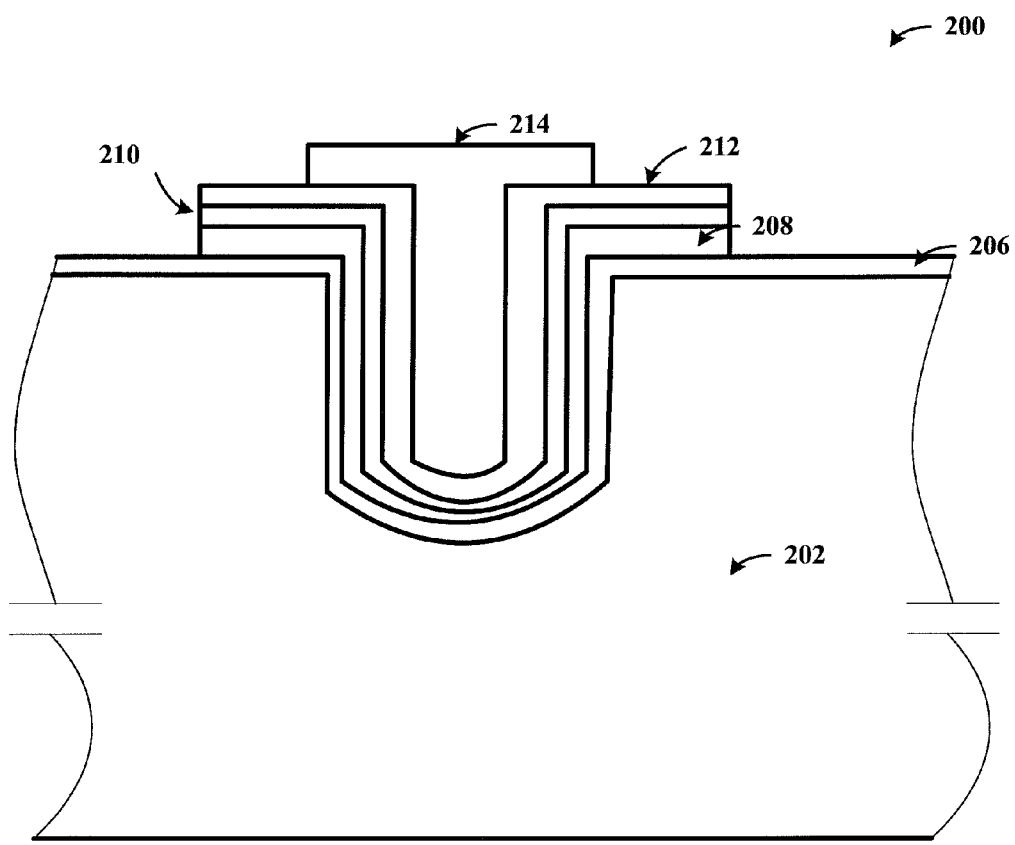

FIG. 2F depicts a complete MIM capacitor stack 200, consistent with another example embodiment of the present disclosure, with an inner metal layer 214 located on a dielectric layer 212 and forming part of a capacitive structure. The inner metal layer 214 can be deposited on dielectric layer 212 as shown in FIG. 2E. In certain embodiments the metal layer 214 is made of the same material as metal layer 210. In other embodiments metal layer 214 is made of a different material than metal layer 210. In some implementations, layer 214 does not fill the complete trench. In other implementations, the surface area of the bottom electrode is larger than the top electrode to facilitate the contacting of the electrodes.

Figure 2G:
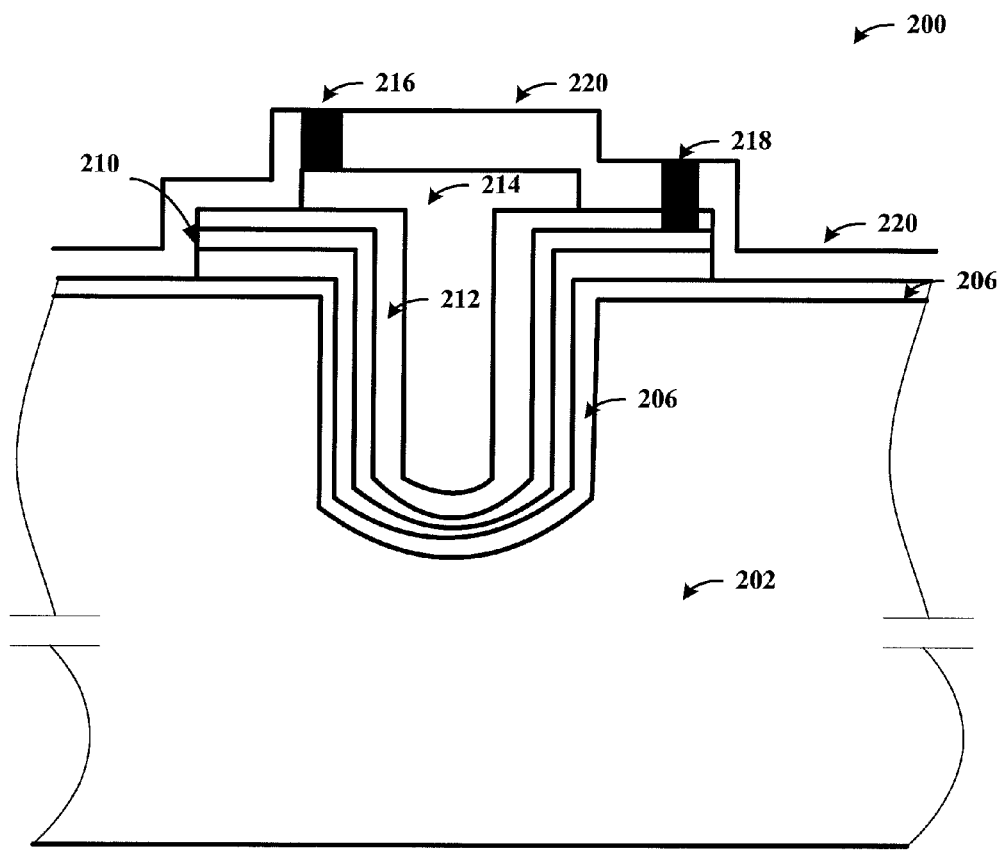

FIG. 2G shows an electronic device 200 including an MIM capacitor, consistent with another example embodiment of the present disclosure. The device 200 may be formed in accordance with the MIM capacitor device 200 shown in FIG. 2F, with additional connections for circuit applications. A conductive interconnect 216 functions as a connection pad to facilitate connection to the inner metal layer 214 of the MIM capacitor. Similarly, interconnect 218 allows for connection of metal layer 210 of the MIM capacitor. A passivating layer 220 such as SiN protects and isolates the MIM capacitor. In embodiments in which the trench is not completely filled with layer 214, the passivating layer 220 follows the topography of the three dimensional surface.

The respective connectors 216 and 218 provide connectivity to each respective electrode (210/214) of the MIM capacitor, and can be formed of one or more of a variety of materials. In certain embodiments one or both interconnects 216 and 218 include an aluminum-based material. In other embodiments, one or both of the metal interconnects include copper based material. In still other embodiments, one or both of the connectors 216 and 218 include a semiconductor material or modified/doped semiconductor material.

Various embodiments described above and shown in the figures may be implemented together and/or in other manners. One or more of the items depicted in the drawings/figures can also be implemented in a more separated or integrated manner, or removed and/or rendered as inoperable in certain cases, as is useful in accordance with particular applications. For example, the Ta/Pt stack can be useful for applications other than a MIM capacitor. In view of the description herein, those skilled in the art will recognize that many changes may be made thereto without departing from the spirit and scope of the present disclosure.

The invention claimed is:

1. An electronic device comprising:
a substrate having a surface and a three dimensional structure with high aspect ratio sidewalls; and
a metal-insulator-metal (MIM) capacitor including
a first capacitor electrode including a platinum group metal (PGM)- based layer and a Ta-based layer, the Ta-based layer being between the PGM-based layer and one of the sidewalls,
a second capacitor electrode, and an insulator material between the first and second electrodes; wherein
the sidewalls of the three dimensional structure extend from an exposed region near a surface of the substrate to a buried region within the substrate and have an aspect ratio of at least about 3.5:1 relative to a spacing between the sidewalls near the buried region, and
the spacing between the sidewalls at the buried region effects deposition step coverage of the Ta-based layer that is less than about 20% of a deposited thickness of the Ta-based layer on a portion of the substrate surface adjacent the exposed region.

2. The electronic device of claim 1, wherein
the sidewalls of the three dimensional structure extend from an exposed region near a surface of the substrate to a buried region within the substrate and have an aspect ratio of at least about 3:1 relative to a spacing between the sidewalls near the buried region.

3. The electronic device of claim 1, wherein the Ta-based layer is configured to bond to the substrate using a Ta-O bond.

4. The electronic device of claim 1, wherein the Ta-based layer is thicker than the PGM-based layer.

5. The electronic device of claim 1, wherein the PGM-based layer consists of platinum.

6. The electronic device of claim 1, wherein the Ta-based layer includes Ta and Nitrogen.

7. The electronic device of claim 1, wherein
the substrate includes an oxide, and
the first capacitor electrode is configured to use the Ta-based layer to bond to an oxide in the substrate to resist delamination in response to high temperature annealing.

8. The electronic device of claim 1, wherein the Ta-based layer includes β phase Ta.

9. The electronic device of claim 1, wherein the Ta-based layer includes nitrogen incorporated into a crystal lattice structure of the Ta-based layer.

10. The electronic device of claim 1, wherein
the sidewalls of the three dimensional structure extend from an exposed region near a surface of the substrate to a buried region within the substrate, and
the first capacitor electrode extends onto a surface of the substrate adjacent the sidewalls at the exposed region.

11. The electronic device of claim 1, wherein the insulator material consists of a high-k dielectric material that requires an annealing temperature of at least 500° C. to acquire a high permittivity phase.

12. The electronic device of claim 1, wherein the insulator material consists of a material selected from the group of: lead zirconium titanate (PZT), strontrium titanate (STO), and barium strontium titanate (BST).

13. The electronic device of claim 1, wherein a bottom electrode stack consists of a Ta-based layer and a platinum group metal (PGM) based layer.

14. An electronic device comprising:
a substrate having a high-aspect ratio trench having sidewalls extending from an upper surface of the substrate surface to a trench bottom in the substrate;
a dielectric insulator liner on the sidewalls in the trench;
an adhesion layer along the dielectric insulator liner along the sidewalls, the adhesion layer and including a Ta-based material configured to bond to the dielectric insulator liner;
a platinum group metal (PGM) -based layer on the adhesion layer along the sidewalls;
an insulator layer on the PGM-based layer along the sidewalls; and a second capacitor electrode on the insulator layer and forming, with the PGM-based layer and the insulator layer, metal, insulator and metal portions of a metal-insulator-metal (MIM) capacitor in the trench;
the sidewalls of the three dimensional structure extend from an exposed region near a surface of the substrate to a buried region within the substrate and have an aspect ratio of at least about 3.5:1 relative to a spacing between the sidewalls near the buried region, and
the spacing between the sidewalls at the buried region effects deposition step coverage of the Ta-based layer that is less than about 20% of a deposited thickness of the Ta-based layer on a portion of the substrate surface adjacent the exposed region.

15. The electronic device of claim 14, wherein the high-aspect ratio trench has an aspect ratio, of height along the sidewalls to width at the trench bottom, of at least four to one.

16. The electronic device of claim 14, wherein the Ta-based layer and the PGM-based layer form a first electrode of the MIM capacitor and extend out of the trench and along the upper surface of the substrate with the Ta-based layer in contact with the upper surface of the substrate.

17. The electronic device of claim 14, wherein the Ta-based layer has a crystal lattice structure with nitrogen incorporated into a Ta crystal lattice to mitigate a diffusion rate of other elements through the lattice.

18. The electronic device of claim 14, wherein
the sidewalls face one another,
the dielectric insulator layer, adhesion layer, PGM-based layer and insulator layer extend along the sidewalls and the trench bottom, and
the second capacitor electrode is a single electrode in a middle portion of the trench and configured to capacitively couple to portions of the PGM-based layer on the sidewalls facing one another and the trench bottom.

19. A method of forming an electronic device, the method comprising:
in a substrate, forming a high-aspect ratio trench having sidewalls extending from an upper surface of the substrate surface to a trench bottom in the substrate;
forming a dielectric insulator liner on the sidewalls in the trench;
forming an adhesion layer along the dielectric insulator liner along the sidewalls, the adhesion layer including a Ta-based material, and using the Ta-based material to bond to the dielectric insulator liner;
forming a platinum group metal (PGM)-based layer on the adhesion layer along the sidewalls;
forming an insulator layer on the PGM-based layer along the sidewalls; and forming a second capacitor electrode on the insulator layer to form, with the PGM-based layer and the insulator layer, metal, insulator and metal portions of a metal-insulator-metal (MIM) capacitor in the trench; wherein
forming a high-aspect ratio trench includes forming a trench having an aspect ratio, of height along the sidewalls to width at the trench bottom, of at least 3.5:1, and
forming an adhesion layer includes forming an adhesion layer along the sidewalls of the trench and on the upper surface of the substrate, the thickness of the adhesion layer near the trench bottom being less than about 20% of the thickness of the adhesion layer on the upper surface of the substrate, as set by the aspect ratio of the trench and the step coverage of the adhesion layer.

20. The method of claim 19, wherein forming a high-aspect ratio trench includes forming a trench having an aspect ratio, of height along the sidewalls to width at the trench bottom, of at least 4:1.

21. The method of claim 19, wherein
forming a high-aspect ratio trench includes forming a high-aspect ratio trench having opposing sidewalls that face one another and extend from an upper surface of the substrate surface to a trench bottom in the substrate,
forming the dielectric insulator layer, adhesion layer, PGM-based layer and insulator layer includes forming the layers along the opposing sidewalls and the trench bottom, and
forming the second capacitor electrode includes forming a single electrode in a middle portion of the trench for capacitively coupling to the PGM-based layer on opposing sidewalls and the trench bottom.

* * * * *